(12) United States Patent
Moench et al.

(10) Patent No.: US 9,153,941 B2
(45) Date of Patent: Oct. 6, 2015

(54) VERTICAL CAVITY SURFACE EMITTING LASER DEVICE WITH ANGULAR-SELECTIVE FEEDBACK

(75) Inventors: Holger Moench, Vaals (NL); Stephan Gronenborn, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 624 days.

(21) Appl. No.: 13/391,295

(22) PCT Filed: Aug. 16, 2010

(86) PCT No.: PCT/IB2010/053686
§ 371 (c)(1),
(2), (4) Date: Feb. 20, 2012

(87) PCT Pub. No.: WO2011/021139
PCT Pub. Date: Feb. 24, 2011

(65) Prior Publication Data
US 2012/0147912 A1    Jun. 14, 2012

(30) Foreign Application Priority Data
Aug. 20, 2009   (EP) .................................... 09168319

(51) Int. Cl.
*H01S 5/183* (2006.01)
*H01S 5/14* (2006.01)
*H01S 5/187* (2006.01)

(52) U.S. Cl.
CPC .............. *H01S 5/18388* (2013.01); *H01S 5/14* (2013.01); *H01S 5/187* (2013.01); *H01S 5/18394* (2013.01); *H01S 2301/18* (2013.01); *H01S 2301/203* (2013.01)

(58) Field of Classification Search
CPC ....... H01S 5/14; H01S 5/187; H01S 5/18394; H01S 5/18388; H01S 2301/203; H01S 2301/18
USPC ..................................................... 372/50.124
See application file for complete search history.

(56) References Cited

U.S. PATENT DOCUMENTS 4,752,130 A     6/1988  George et al.
5,060,233 A  * 10/1991  Harder et al. ................... 372/22

(Continued)

FOREIGN PATENT DOCUMENTS

JP          2004119831 A      4/2004

OTHER PUBLICATIONS

Y. Tanguy et al, "Characteristics of cavity solitons and drifting excitations in broad-area vertical-cavity surface-emitting lasers with frequency-selective feedback", Physical Review A78, (2008) pp. 023810-1 to 023810-10.

(Continued)

*Primary Examiner* — Xinning Niu

(57) ABSTRACT

The present invention relates to a laser device comprising at least one large area VCSEL (101) and at least one optical feedback element (201, 301) providing an angular-selective feedback for laser radiation emitted from the laser. The angular-selective feedback is higher for at least one portion of laser radiation emitted at angles θ>0 to the optical axis (601) of the laser than for laser radiation emitted on said optical axis (601). The invention also refers to a method of stabilizing a laser emission of a large area VCSEL in a desired angular distribution (501, 502). With the proposed device and method, the intensity distribution of a large area VCSEL can be stabilized in a desired shape, for example a ring shape.

16 Claims, 6 Drawing Sheets

(56) References Cited

U.S. PATENT DOCUMENTS

| | | | |
|---|---|---|---|
| 5,327,447 A * | 7/1994 | Mooradian | 372/92 |
| 5,940,422 A | 8/1999 | Johnson | |
| 6,084,900 A | 7/2000 | Claisse et al. | |
| 6,741,629 B1 * | 5/2004 | Garnache et al. | 372/96 |
| 6,798,438 B2 | 9/2004 | Beier | |
| 7,257,141 B2 | 8/2007 | Chua | |
| 7,394,842 B2 | 7/2008 | Glebov et al. | |
| 2006/0171440 A1 | 8/2006 | Ledentsov et al. | |
| 2007/0291798 A1 * | 12/2007 | Kenny et al. | 372/6 |
| 2007/0291805 A1 | 12/2007 | Ledentsov et al. | |
| 2008/0298406 A1 * | 12/2008 | Day et al. | 372/39 |
| 2008/0304535 A1 | 12/2008 | Parriaux et al. | |
| 2009/0180506 A1 * | 7/2009 | Maeda et al. | 372/44.01 |

OTHER PUBLICATIONS

Bernd Terhalle et al, "Control of broad-area vertical-cavity surface emitting laser emission by optically induced photonic crystals", Applied Physics Letters 93, (2008), pp. 151114-1 to 151114-3.

S. Wolff et al, "Fourier-optical selection of higher order transverse modes in broad area lasers", Optics Express 37, vol. 5, No. 3, Aug. 2, 1999.

Mei Ting Cha, "Spatially Filtered Feedback for Mode Control in Vertical-Cavity Surface-Emitting Lasers", Journal of Lightwave Technology, vol. 26, No. 24, Dec. 15, 2008, pp. 3893-3900.

M. Schulz-Ruhthenberg et al, "Transverse patterns and length-scale selection in vertical-cavity surface-emitting lasers with a large square aperture", Appl. Phys. B 81, (2005), pp. 945-953.

S. P. Hegarty, "Transverse-mode structure and pattern formation in oxide-confined vertical-cavity semiconductor lasers", J. Opt. Soc. Am. B/vol. 16, No. 11, Nov. 1999, pp. 2060-2071.

Hong Lin et al, "Transverse mode selection in a vertical-cavity surface-emitting laser by preferential alignment of optical feedback", Optics Communications, North-Holland Publishing Co., vol. 274, No. 1, Apr. 10, 2007, pp. 130-135.

Sandra Wolff, et al, "Fourier-Optical Transverse Mode Selection in External-Cavity Broad-Area Lasers: Experimental and Numerical Results", IEEE Journal of Quantum Electronics IEEE USA, vol. 39, No. 3, Mar. 2003, pp. 448-449.

* cited by examiner

VERTICAL CAVITY SURFACE EMITTING LASER DEVICE WITH ANGULAR-SELECTIVE FEEDBACK

TECHNICAL FIELD AND BACKGROUND OF THE INVENTION

The present invention relates to a laser device comprising at least one large area vertical cavity surface emitting laser (VCSEL) and at least one optical feedback element providing an angular-selective feedback for laser radiation emitted from said laser. The invention also refers to a method of stabilizing the laser emission of a large area vertical cavity surface emitting laser by angular-selective optical feedback.

High power diode lasers show an increasing number of applications in material processing like cutting, welding or soldering as well as in medicine. Also vertical cavity surface emitting lasers now reach higher output power per device and offer easy scalability in form of 2-dimensional arrays.

The emission of lasers is usually described in terms of Gaussian modes and most lasers are designed to have a fundamental Gaussian intensity distribution. For many laser applications however, especially in material processing or medical applications, different intensity distributions are required in the working plane, e.g. top-hat circular or rectangular shapes or ring structures. Beam homogenizers consisting of one or several lens arrays and at least one Fourier lens can be applied to shape the laser beam to the desired intensity distribution, but have to be carefully aligned in the beam. Furthermore, due to the coherence of the laser beam unwanted artifacts can appear. In addition, ring profiles can only be realized with a significant power loss by the beam homogenizers. Especially such ring shaped intensity profiles can be advantageous in material processing and medical applications. For example, ring profiles can be used in plastic welding to avoid scanning the laser beam on a circular weld seam. Another example is the heating of materials with a high thermal conductivity. If the laser beam used has a top-hat intensity distribution, the temperature distribution on the surface of the workpiece is peaked in the middle due to the better cooling of the rim. With a matched ring shape of the laser beam, the middle peak can be avoided, heating a circular area homogenously.

Small area VCSELs are known to emit Gauss modes. Higher output powers can be achieved by larger active areas, but then the emission changes to distributions best described by Fourier modes. With such large area VCSELs the emission angle of laser radiation depends on the detuning of cavity resonance and optical gain peak as well as on several etalon effects. Large area VCSELs tend to emit mainly in one or more distinct angles depending very sensitive on temperature, driving current and design of the laser. This dependence however results in a shift of the far field with changing current or temperature, as the detuning will change.

SUMMARY OF THE INVENTION

It is an object of the present invention to provide a laser device which can be easily designed to emit laser radiation with a desired and stabilized intensity distribution in the far field, as well as a method for stabilizing the laser emission of a vertical cavity surface emitting laser in a desired angular distribution.

The object is achieved with the laser device and method according to claims 1 and 14. Advantageous embodiments of the laser device and method are subject matter of the dependent claims or are described in the subsequent portions of the description.

The proposed laser device comprises at least one large area vertical cavity surface emitting laser (VCSEL) having an optical axis, and at least one optical feedback element providing an angular-selective feedback for laser radiation emitted from said laser. The angular-selective feedback provided by the feedback element is higher for at least one portion of laser radiation emitted at angles $\theta>0$ to said optical axis than for laser radiation emitted on said optical axis.

The invention therefore suggests to use one or several large area VCSELs and to stabilize the emission of these VCSELs in a desired angular distribution by applying angular-selective feedback. A large area VCSEL is a VCSEL in which the laser emission is dominated by Fourier modes. Such a large area VCSEL typically has an emission area of $\geq 80$ µm$^2$, preferably $\geq 300$ µm$^2$. While it is known to stabilize a single fundamental mode of a small area VCSEL for laser radiation emitted on the optical axis, the inventors of the present invention surprisingly discovered that angular-selective feedback at emission angles $>0$ yields stable emission patterns with a large area VCSEL for a wide range of driving currents and temperatures. With this angular-selective feedback the angular intensity distribution in the far field of the laser can be easily adapted to the corresponding application. It is thus possible to design such a laser device to emit for example laser beams with ring shaped intensity distributions or intensity profiles preferable in several applications. The far field of such a laser device shows an excellent stability for the whole range of driving currents and different temperatures.

The optical feedback element may be formed of a combination of elements, for example a combination of a lens and a mirror, wherein the mirror has to be partially transparent for the emitted laser radiation. The feedback element may also be composed of one single element providing the angular-selective optical feedback for the laser radiation. This angular-selective optical feedback can be achieved by a reflecting surface with spatially modulated reflectivity or by other effects, in particular different imaging conditions for different angles of laser emission. Such different imaging conditions may be achieved for example using an optical element with at least one free form surface, which is shaped to reflect only portions of laser radiation back into the inner laser cavity for which feedback is desired.

In a preferred embodiment, the angular-selective optical feedback is designed such that a ring shaped intensity distribution is stabilized in the far field of the laser device. This requires a feedback element designed to provide a higher feedback for a ring shaped angular distribution of the emitted laser radiation than for the remaining portions.

The feedback element and the outcoupling mirror of the VCSEL are preferably designed such that a product of the reflectivities of the outcoupling mirror and the surface portion of the feedback element providing the higher feedback is larger than 98%, preferably larger than 99%, more preferably larger than 99.5%.

The feedback may be chosen higher for ranges of angles $\theta$ which lie between a smaller angle $\theta_1$ and a larger angle $\theta_2$, all of these angles being $>0$. The feedback may also be higher only for portions of laser radiation emitted at such an angle $\theta$, i.e. not for the whole ring shape around the optical axis, for example only one or several spot-like regions. The distribution of the regions of higher optical feedback depends on the desired intensity distribution in the far field.

Preferred examples of feedback elements are curved mirrors with spatially structured or modulated reflectivity, combinations of lenses and flat mirrors with spatially structured or modulated reflectivity, a combination of one lens with spheric aberration and a flat mirror, gratings or prisms. The feedback elements or components of the feedback elements can be provided on a separate optical material like glass or plastic, i.e. by an external element, or can be realized on an optical material like glass or plastic which is bonded to the laser substrate. The feedback element or components thereof may also be realized on an optical material like glass or plastic, which is bonded directly to the laser structure or may be integrated in the laser substrate. The feedback element or components thereof can also be realized on an epitaxial layer on the laser.

With the proposed method it is possible to achieve a higher stabilization for laser radiation emitted at an angle >0 to the optical axis than for a fundamental mode of the laser radiation emitted on the optical axis, if such an on-axis mode would be stabilized by corresponding optical feedback. The on-axis emission can be affected by filamentation more easily, while the large angles are more robust against small inhomogenies of the gain medium or the inner cavity. Higher stabilization in particular means a larger operating range of the laser with respect to driving current and temperature.

In an advantageous embodiment the thus stabilized intensity distribution is transformed with a further optics to a Gauss like distribution in order to achieve such an intensity distribution in the far field with high stability. To this end, an optics with at least two free form surfaces is required, for example to transform a ring shaped stabilized optical intensity distribution to a Gauss like intensity distribution. With such a measure, a very high stability of a Gauss like intensity distribution can be achieved for large area VCSELs, which is not possible when trying to stabilize the on axis radiation by optical feedback.

BRIEF DESCRIPTION OF THE DRAWINGS

The proposed laser device and corresponding method are described in the following by way of example in connection with the accompanying figures without limiting the scope of protection as defined by the claims. The figures show FIG. 1 a first example of a laser device according to the present invention;

DETAILED DESCRIPTION OF EMBODIMENTS

Figure 1:
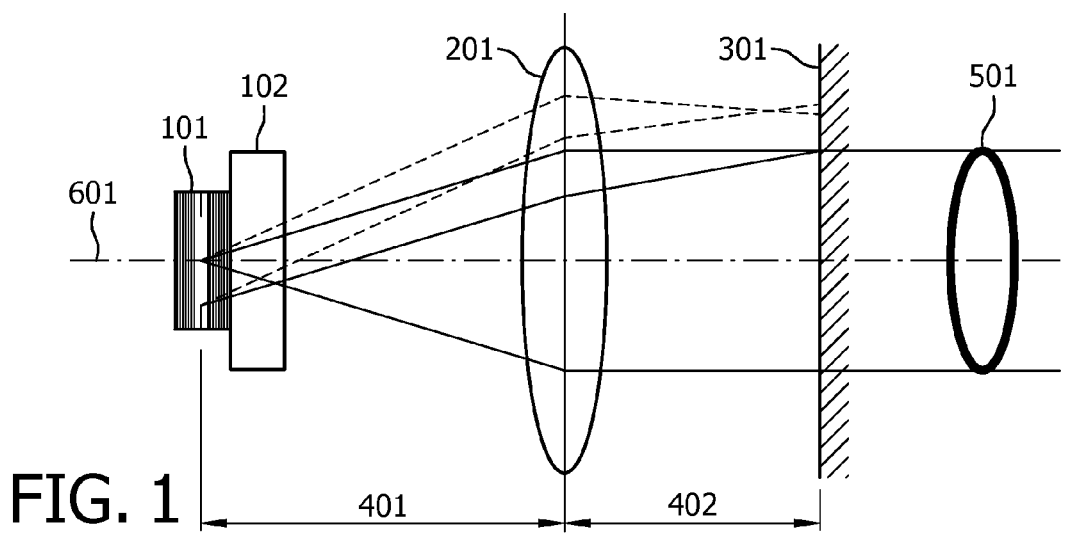

FIG. 1 shows a first example of the proposed laser device. The laser device comprises a large area VCSEL 101 on an optically transparent substrate 102. The feedback element is formed of a combination of a bi-convex spheric lens 201 and a flat mirror 301 which is partially transparent for the laser radiation. In this example, the bi-convex lens has a focal length of f=25 mm and a diameter of 22.4 mm. The flat mirror 301 has a reflectivity of R=50%. Lens 201 and flat mirror 301 are arranged forming an external cavity in a nearly mirrored self-imaging configuration, i.e. the optical distance 401 between the active layer of the laser and the lens and the optical distance 402 between the lens and the mirror are approximately equal to the focal length f of the lens.

Due to the spheric aberration of lens 201, only light emitted under the right angle to the optical axis 601 is perfectly collimated. After reflection from the external mirror 301 it is fed back into the active area of the laser, reducing the laser threshold. The VCSEL thus starts to lase in a ring mode, perfectly controlled by the external resonator and stable over all operating currents and a large temperature range. This results in a ring shaped intensity distribution 501 (ring shaped beam profile) in the far field as depicted in FIG. 1. By changing the distance 401 between the VCSEL 101 and the lens 201, the size or radius of the ring can be changed, only limited by the aperture of the lens or the mirror. Due to the large Fresnel number of a large area VCSEL cavity, geometric optic is sufficient to described the resonator. Therefore, ray tracing programs can be used to easily design the external feedback in order to achieve a desired intensity distribution in the far field.

In order to achieve an optimum beam stabilization and highest output power, the right reflectivity ratio between the VCSEL outcoupling mirror and the external mirror, i.e. mirror 301 in the present example, should be selected. The reflectivity of the outcoupling mirror can be between 0.1 and 99.95%, preferably between 10 and 99.5%, more preferably between 70 and 95%. The reflectivity of the feedback mirror should be between 5 and 99.5%, preferably between 10 and 95%, more preferably between 30 and 90%, such that the product of both reflectivities is larger than 98%, preferably larger than 99%, more preferably larger than 99.5%. In the most simplest case the reflectivity of the outcoupling mirror is selected such that the device does not lase at all without external feedback and the reflectivity of the external mirror is matched to maximize output power using a transfer matrix approach, considering absorption in the VCSEL mirrors and the substrate.

Figure 2:
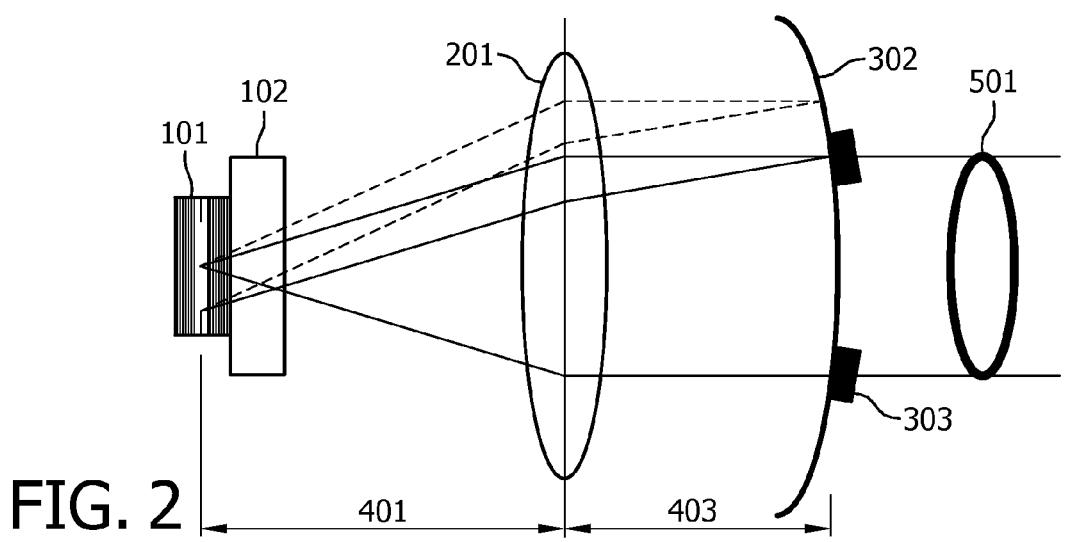
FIG. 2 a second example of a laser device according to the present invention.

FIG. 2 shows a further example of the proposed laser device. In this example, instead of the flat mirror 301 a spheric mirror 302 is arranged at a distance 403 behind the spheric lens 201. Also in this example, an external self-imaging cavity is formed by spheric lens 201 and spheric mirror 302. Self-imaging allows a single external cavity for multiple devices. The mode can be controlled by the spatial modulation of the reflectivity of the spheric mirror 302, i.e. by a reflection coating 303 and/or by an anti-reflection coating in the remaining areas not used for feedback. The distance 403 between the lens 201 and the external mirror 302 is preferably equal to the sum of the focal length f of the lens 201 and the mirror radius of curvature.

Figure 3:
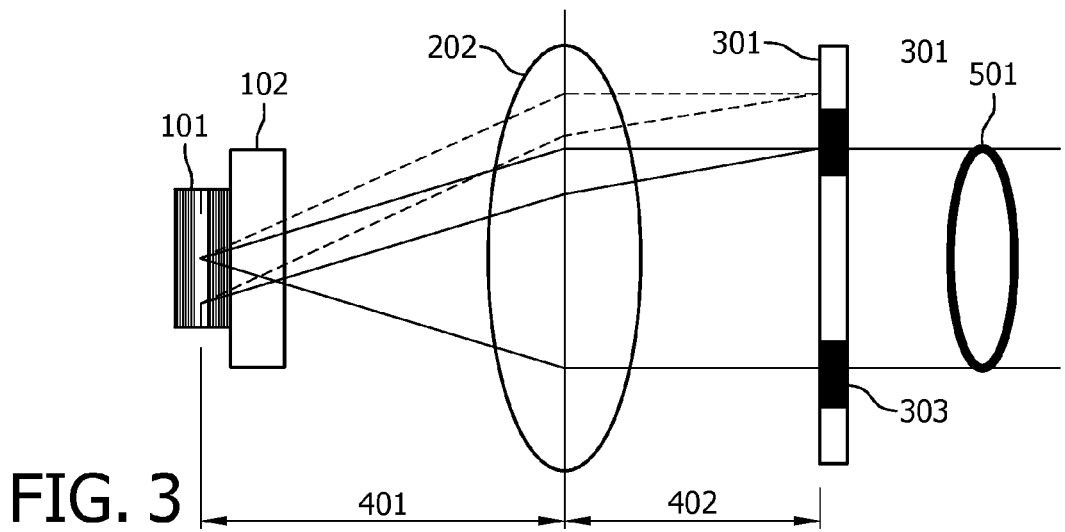
FIG. 3 a third example of a laser device according to the present invention.

FIG. 3 shows a further example of a laser device according to the present invention. An external mirror imaging cavity is formed by an aspheric lens 202 and a flat mirror 301 with spatially structured reflectivity. Due to the aspheric lens 202, all emission angles are supported by the cavity and the laser mode can be controlled by the spatial modulation of the flat mirror reflectivity, i.e. by appropriate reflection coatings 303 and/or by an anti-reflection coating in the remaining areas not used for feedback.

In the above and the following examples, the depicted ring shaped intensity distribution 501, 502 in the far field is generated due to the higher feedback for this ring shaped laser mode compared to the other laser modes.

Figure 4:
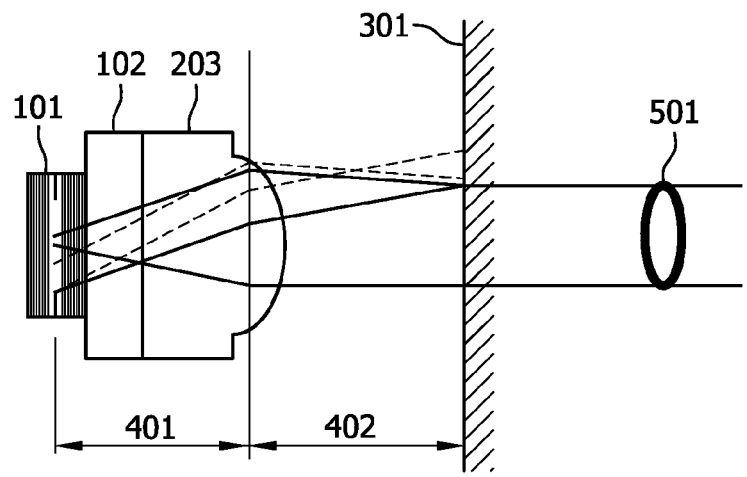
FIG. 4 a fourth example of a laser device according to the present invention.

FIG. 4 shows an example of the proposed laser device with a hybrid integration of lens 203 with is bonded on substrate 102. The feedback element is formed by this integrated lens 203 and the external mirror 301. This arrangement which works like the arrangement of FIG. 1, still allows the tuning of the emission or beam profile by changing the distance 402 between lens 203 and external mirror 301.

Figure 5:
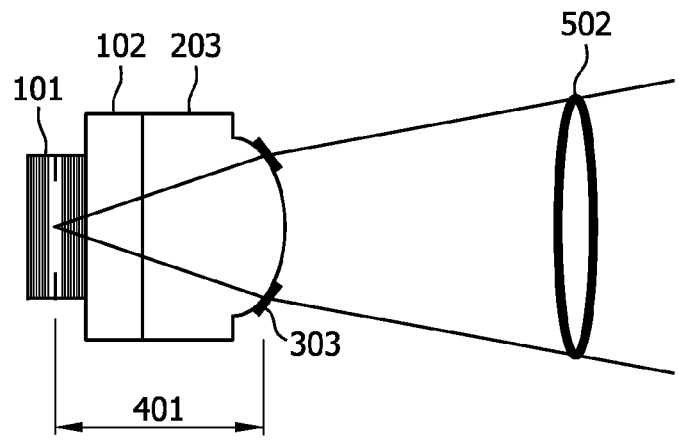
FIG. 5 a fifth example of a laser device according to the present invention.
Figure 10:
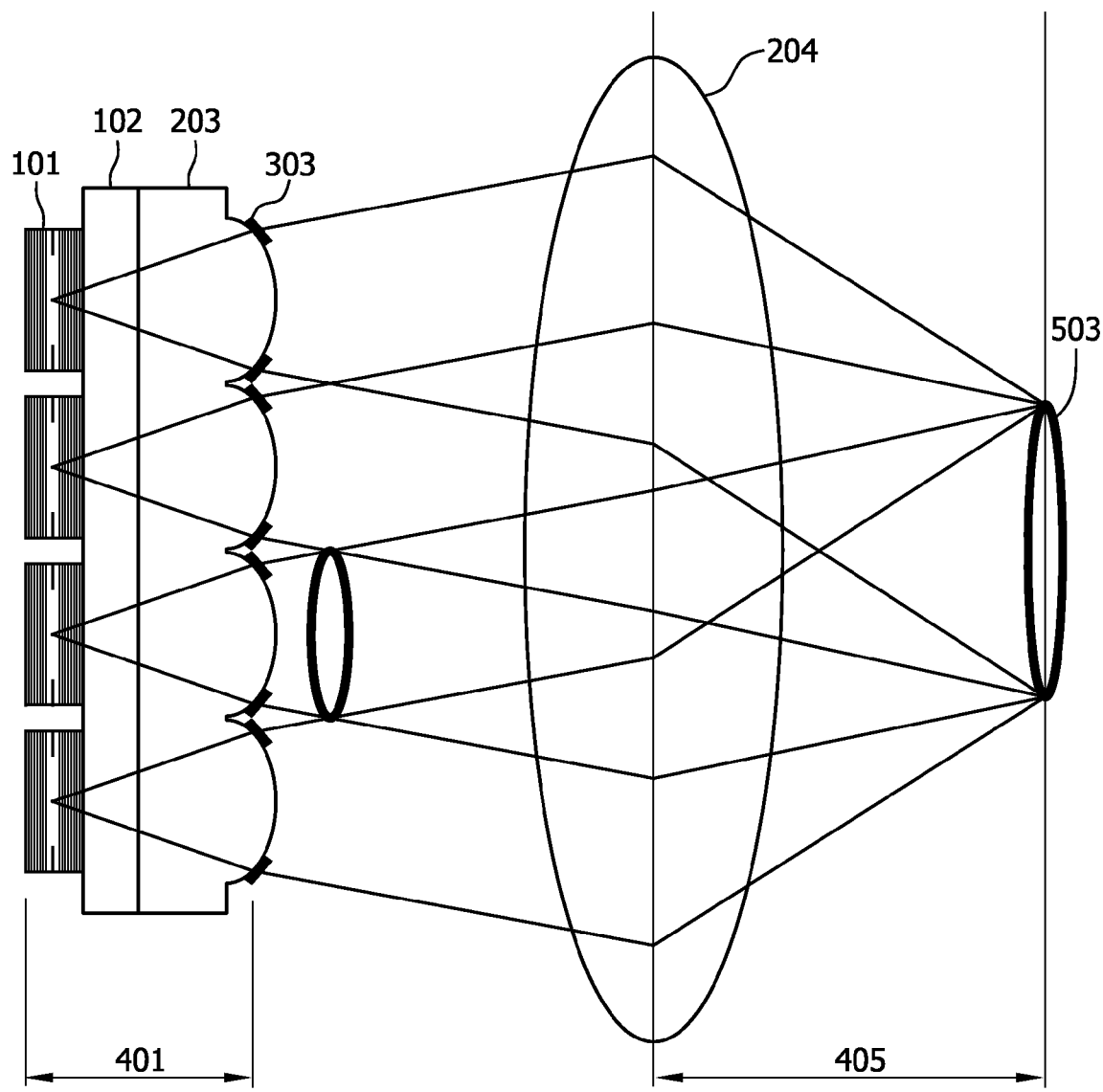
FIG. 10 a tenth example of a laser device according to the present invention.

FIG. 5 shows a further example of the proposed laser device. In this example, a spheric mirror 203 having a structured reflectivity on its surface, realized by reflection coating 303, is bonded to substrate 102 of the laser device. The mirror curvature is matched to the distance 401 between the active layer of the VCSEL 101 and the mirror surface of this external mirror 203. The form and position of reflection coating 303 defines the emission angle of the divergent beam and thus the beam profile 502. This construction of the device can also be applied on VCSEL arrays with a beam combination in the far field, for example as shown in FIG. 10.

Figure 6:
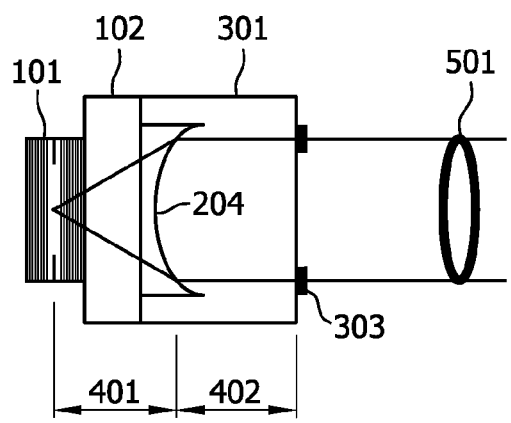
FIG. 6 a sixth example of a laser device according to the present invention.

FIG. 6 shows a further example of the proposed laser device, in which a spheric lens 204 and a flat mirror 301 are hybridly integrated, in particular bonded to substrate 102. The reflectivity of flat mirror 301 is modulated by a reflection coating 303 in order to achieve the desired feedback. This device emits a collimated beam with ring shaped beam profile 501: The size of this beam profile 501 can be made tunable with piezoelectric elements (not shown in the figure) changing the distance 401 between VCSEL 101 and lens 204.

Figure 7:
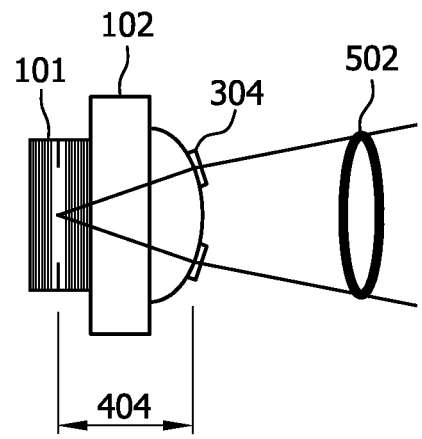
FIG. 7 a seventh example of a laser device according to the present invention.

FIG. 7 shows a further example of a laser device according to the present invention. In this embodiment, a spheric mirror 304 is monolithically integrated by shaping the substrate 102 of the laser. The reflecting surface of spheric mirror 304 is spatially modulated in reflectivity by a refection coating. The emission angle is controlled by this spatial modulation of the reflectivity of mirror 304.

Figure 8:
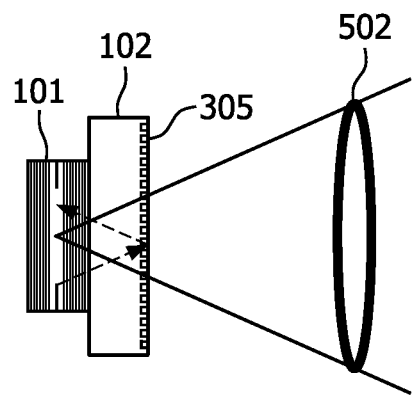
FIG. 8 a eighth example of a laser device according to the present invention.

FIG. 8 shows a sectional view of a further example of the proposed laser device with a monolithically integrated feedback element. In this example, the substrate 102 of the laser is shaped to a grating 305. The grating period determines the accepted angle for the feedback, resulting in a ring shaped beam profile 502 in this case. The grating may be a 1-dimensional or a 2-dimensional grating.

Figure 9:
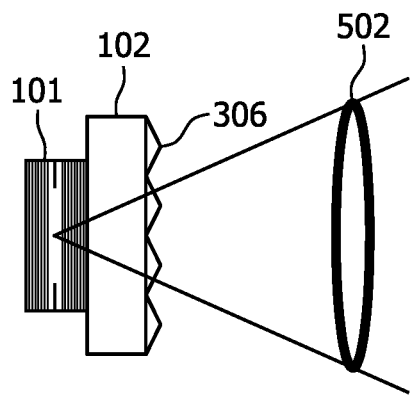
FIG. 9 a ninth example of a laser device according to the present invention.

FIG. 9 shows a sectional view of another example of the proposed laser device. This example is based on a monolithic integration of a micro-prism array 306 by appropriately shaping the substrate 102 of the laser. The prisms are designed such that a reflection for feedback is only achieved for one or several certain desired angles.

It is obvious for the skilled person that instead of integrating the feedback elements 305, 306 of FIGS. 8 and 9, these feedback elements 305, 306 may also be arranged separately.

Figure 11:
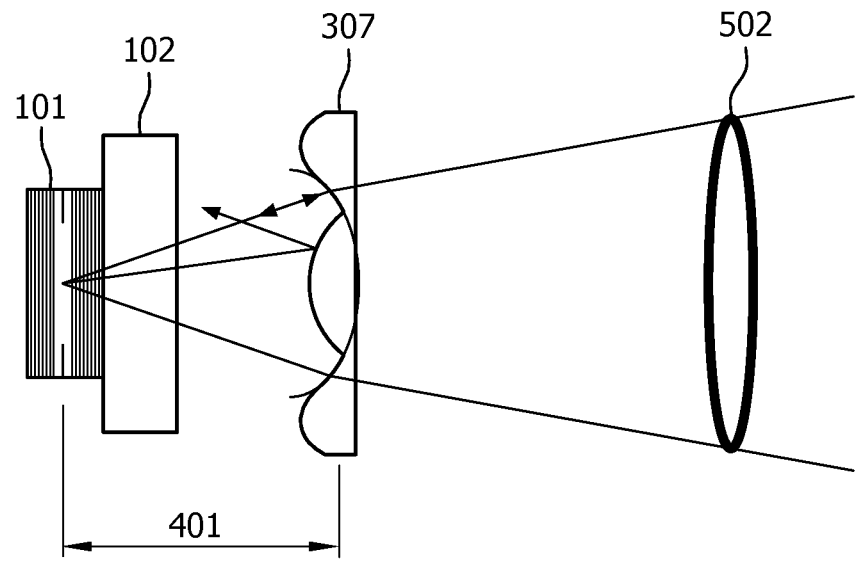
FIG. 11 an eleventh example of a laser device according to the present invention.
Figure 12:
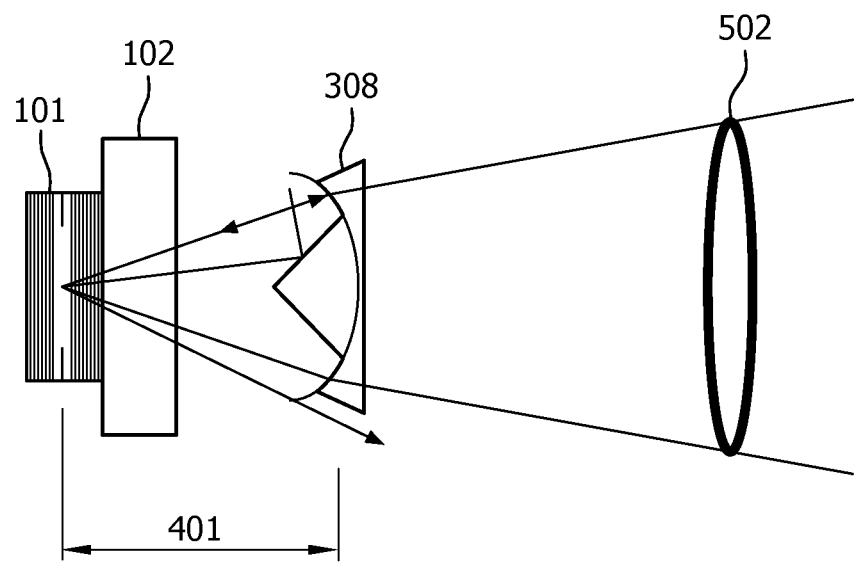
FIG. 12 a twelfth example of a laser device according to the present invention.

FIGS. 11 and 12 show two further examples of the proposed laser device. In these examples the feedback element is formed by an optical element 307, 308 having an appropriately designed free form surface. The free form surface is shaped such that only laser radiation emitted at the desired angles is reflected back into the inner laser cavity of the VCSEL 101 and provides the feedback. Laser radiation emitted at different angles is simply reflected into other directions.

The proposed method and laser device can be easily scaled up to multiple VCSELs. FIG. 10 shows an example of such an upscaling. In this example, an array of VCSELs 101 on a common substrate 102 is used. An array of spherical mirrors 203 is bonded to the substrate 102, the spherical mirrors 203 providing spatially modulated reflectivity by appropriate reflection coatings 303. The ring shaped intensity distributions emitted by each of these arrangements are combined by a Fourier lens 204 incoherently to a single ring shaped intensity distribution 503 in the focal plane at a distance 405 from the Fourier lens 204.

While the invention has been illustrated and described in detail in the drawings and forgoing description, such illustration and description are to be considered illustrative or exemplary and not restrictive. The invention is not limited to the disclosed embodiments. The different embodiments described above and in the claims can also be combined. Other variations to the disclosed embodiments can be understood and effected by those skilled in the art in practicing the claimed invention, from the study of the drawings, the disclosure and the appended claims. For example, also other intensity profiles are possible with most of the embodiments, i.e. other intensity profiles than ring shaped profiles, depending on the spatial structure or modulation of the reflectivity of the corresponding mirrors. For example, one or several lines, several spots, squares or ring top-hat distributions can be designed.

Figure 13:
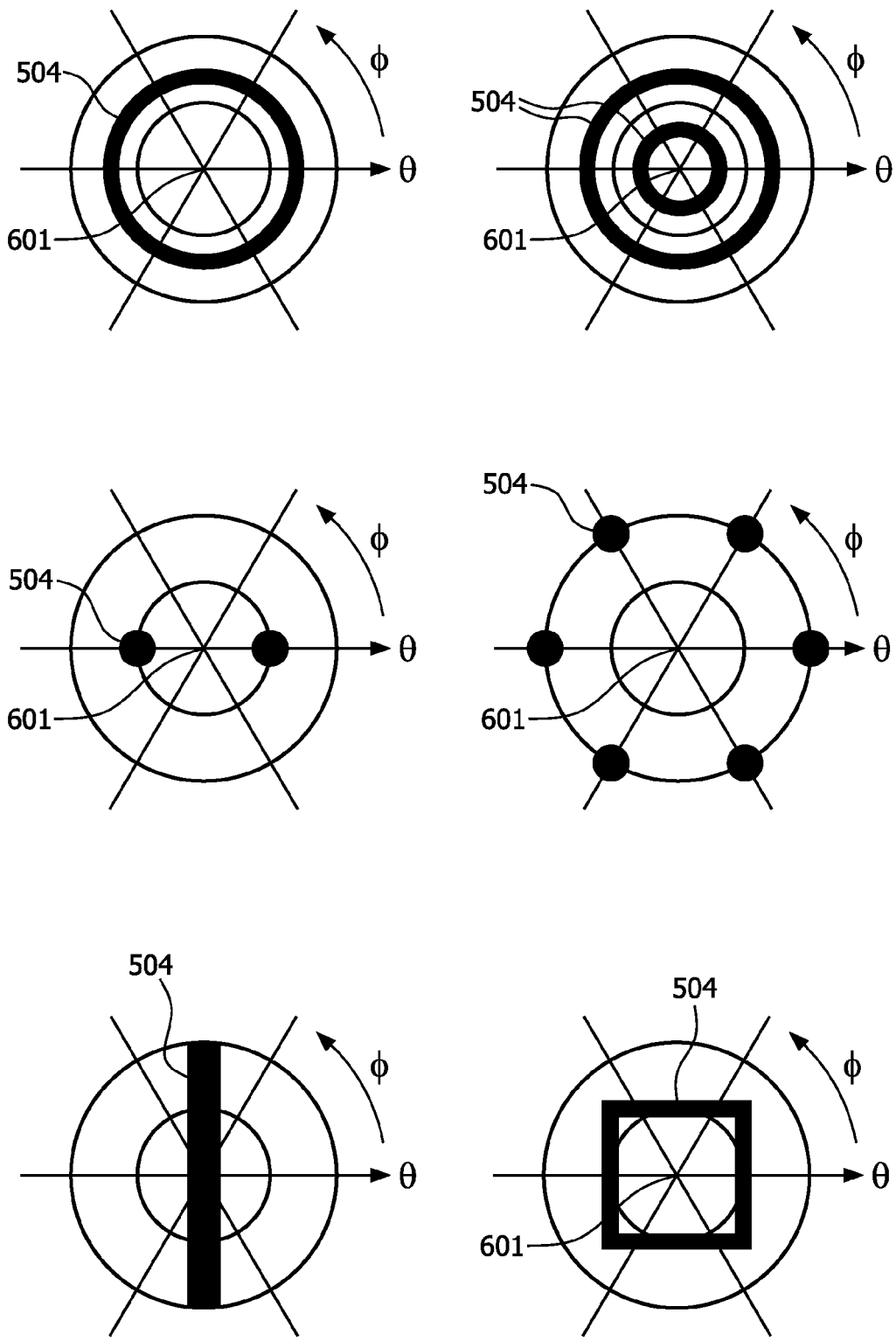
FIG. 13 examples of different beam profiles of the laser device.

FIG. 13 shows examples of different intensity distributions or beam profiles 504 in the working plane which may be generated with the proposed device. In some of these examples the feedback has been chosen higher for portions of laser radiation emitted at only single angles Φ around the optical axis 601 and at the same or at different angles θ. All of the intensity distributions are point symmetric about the optical axis 601. In the claims the word "comprising" does not exclude other elements or steps, and the indefinite article "a" or "an" does not exclude a plurality. The mere fact, that the measures are recited in mutually different dependent claims does not indicate that a combination of these measures cannot be used to advantage. The reference signs in the claims should not be construed as limiting the scope of these claims.

LIST OF REFERENCE SIGNS

101 VCSEL
102 substrate
201 lens
202 aspheric lens
203 spheric mirror
204 spheric lens
301 flat mirror
302 spheric mirror
303 reflective coating
304 spheric mirror
305 grating
306 micro-prism array
307-308 optical element with free form surface
401-405 distances
501-503 ring shaped intensity distribution/beam profile
504 intensity distribution/beam profile
601 optical axis

The invention claimed is:
1. A laser device comprising
at least one large area vertical cavity surface emitting laser, said laser having an optical axis, and at least one optical feedback element providing an angular-selective feedback for laser radiation emitted from said laser, said angular-selective feedback being higher for at least one portion of laser radiation emitted at angles θ>0 to said optical axis than for laser radiation emitted on said optical axis, wherein said angular-selective feedback is higher for portions of laser radiation which are point symmetric about said optical axis than for laser radiation emitted on said optical axis such that an intensity distribution of laser radiation in a working plane is point symmetric about the optical axis.

2. The laser device according to claim 1, wherein said feedback element comprises a curved mirror having at least one region containing a reflective coating, thereby resulting in the mirror yielding a spatially modulated reflectivity.

3. The laser device according to claim 1, wherein said feedback element comprises a combination of at least one lens and a flat mirror.

4. The laser device according to claim 3, wherein said flat mirror has at least one region containing a reflective coating, thereby resulting in the mirror yielding a spatially modulated reflectivity.

5. The laser device according to claim 1, wherein said feedback element comprises a grating.

6. The laser device according to claim 1, wherein said feedback element comprises an array of prisms.

7. The laser device according to claim 1, wherein said feedback element comprises an optical element having at least one free form surface which is shaped to provide said angular-selective feedback.

8. The laser device according to claim 1, wherein said feedback element or a component of said feedback element is bonded on said laser or is monolithically integrated in a substrate of said laser.

9. The laser device according to claim 1, wherein said feedback element is arranged separately from said laser.

10. The laser device according to claim 1, wherein the feedback element is configured such that a product of reflectivities of an outcoupling mirror of the laser and a surface portion of the feedback element providing the higher feedback is larger than 98%.

11. The laser device according to claim 1, wherein several of said lasers with identical feedback elements are arranged in form of an array, and wherein laser radiation of said lasers after passing through said feedback elements is collected by a common lens to be superimposed in a working plane.

12. The laser device according to claim 1, wherein an additional optics is arranged in beam direction after said feedback element, said additional optics being designed to transform an intensity distribution of the laser radiation after passing through the feedback element to a different geometrical shape.

13. A method of stabilizing a laser emission of a large area vertical cavity surface emitting laser in a point symmetric intensity distribution about the optical axis in a working plane, wherein said stabilization is performed by angular-selective optical feedback for laser radiation emitted from said laser, said angular-selective feedback being higher for at least one portion of laser radiation emitted at angles θ>0 to an optical axis of said laser than for laser radiation emitted on said optical axis, wherein said angular-selective feedback is higher for portions of laser radiation which are point symmetric about said optical axis than for laser radiation emitted on said optical axis.

14. The method according to claim 13, wherein said angular-selective feedback is chosen higher for at least one ring-shaped portion of laser radiation than for laser radiation emitted on said optical axis, resulting in a ring-shaped intensity distribution in the far field.

15. The method according to claim 13, wherein said angular-selective feedback is attained by employing a feedback element comprising a lens and an external mirror positioned at a distance from the lens; and, wherein the laser radiation is tuned by changing the distance between the lens and the mirror.

16. The method according to claim 13, wherein said angular-selective feedback is attained by employing a feedback element comprising a lens, the lens being positioned at a distance from the vertical cavity surface emitting laser; and, wherein the laser radiation is tuned by changing the distance between the lens and the vertical cavity surface emitting laser.

* * * * *